United States Patent
Kunce et al.

(10) Patent No.: US 8,120,985 B2
(45) Date of Patent: Feb. 21, 2012

(54) MULTI-BANK MEMORY DEVICE METHOD AND APPARATUS

(75) Inventors: Christopher Kunce, Wake Forest, NC (US); Benjamin Heilmann, Raleigh, NC (US); Alan Daniel, Durham, NC (US)

(73) Assignee: Qimonda AG, Munich (DE)

( * ) Notice: Subject to any disclaimer, the term of this patent is extended or adjusted under 35 U.S.C. 154(b) by 613 days.

(21) Appl. No.: 12/046,870

(22) Filed: Mar. 12, 2008

(65) Prior Publication Data

US 2009/0231943 A1    Sep. 17, 2009

(51) Int. Cl.
*G11C 8/00* (2006.01)
(52) U.S. Cl. .................................. 365/230.03
(58) Field of Classification Search .............. 365/230.03
See application file for complete search history.

(56) References Cited

U.S. PATENT DOCUMENTS

| | | | |
|---|---|---|---|
| 6,188,596 B1 | 2/2001 | Holst | |
| 6,233,196 B1 | 5/2001 | Lee | |
| 6,442,098 B1 * | 8/2002 | Kengeri | 365/230.03 |
| 6,459,647 B1 | 10/2002 | Kengeri | |
| 6,741,488 B1 * | 5/2004 | Heightley et al. | 365/63 |
| 7,630,271 B2 * | 12/2009 | Kim et al. | 365/230.03 |
| 2003/0204665 A1 | 10/2003 | Jain et al. | |
| 2004/0042303 A1 * | 3/2004 | Kirsch | 365/203 |

* cited by examiner

*Primary Examiner* — Hoai V Ho
*Assistant Examiner* — Anthan Tran
(74) *Attorney, Agent, or Firm* — Murphy, Bilak & Homiller, PLLC

(57) ABSTRACT

In one embodiment, a memory device comprises a semiconductor substrate, a first set of memory banks disposed on the semiconductor substrate and a second set of memory banks disposed on the semiconductor substrate. Each memory bank of the second set is split into a plurality of memory bank segments physically separated from each other and from the first set of memory banks. Each memory bank segment is arranged adjacent to, and occupies less area than, one of the memory banks of the first set.

25 Claims, 9 Drawing Sheets

US 8,120,985 B2

MULTI-BANK MEMORY DEVICE METHOD AND APPARATUS

BACKGROUND OF THE INVENTION

Memory devices store information in an array of memory cells. A particular location within the array can be selected by activating the appropriate column and row address. The memory array is typically divided into multiple banks of memory cells which are independently accessible. This allows for the overlapping, or pipelining, of memory accesses. Take, for example, DRAM (dynamic random access memory) devices which conventionally have multiple banks each of which can be independently pre-charged. For a read or write access to a particular bank, the bank is pre-charged independently of the other banks. The bank precharge is thus hidden behind other precharge or data transfer operations, reducing precharge latency and improving data throughput.

As the capacity of memory devices increases, so too does the number of memory banks. For example, one gigabyte DDR2 (double data rate) DRAM devices typically have either four or eight banks depending on the memory device organization. Two gigabyte DDR2 DRAM devices typically have even more banks, e.g., eight or sixteen depending on device organization. Other types of memory devices may have more or less banks. Regardless, the banks are typically fabricated on a semiconductor substrate in the most area-efficient way to maximize yields. Process variation can reduce memory device yields when the layout is not optimal. Packaging considerations must also be taken into account when selecting the layout of a multi-bank memory device. Certain package types may not be feasible depending on the memory device layout such as when the device is too long in the x-direction or too tall in the y-direction.

One conventional approach for arranging the banks of a memory device on a semiconductor substrate involves placing an equal number of memory banks above and below logic common to all banks such as bias circuitry, input/output circuitry, power regulation and distribution circuitry, control logic, decoder logic, etc. However, the memory device becomes too long in the x-direction as the number of banks increases (e.g., from eight to sixteen banks) when arranged in one upper and one lower row. Conversely, the memory device becomes too tall in the y-direction when the banks are stacked above and below the common logic in a columnar arrangement. Another conventional approach involves surrounding the common logic on all sides by memory banks in a donut-like configuration, the centermost portion of the memory device including the common logic. According to this approach, the amount of semiconductor substrate allocated to the common logic is the same as that allocated to each individual bank. Thus, the common logic occupies the same area on the semiconductor substrate as each bank. However, the common logic can often be fabricated in a far smaller space than a memory bank, rendering a portion of the substrate unused.

SUMMARY OF THE INVENTION

In one embodiment, a memory device comprises a semiconductor substrate, a first set of memory banks disposed on the semiconductor substrate and a second set of memory banks disposed on the semiconductor substrate. Each memory bank of the second set is split into a plurality of memory bank segments physically separated from each other and from the first set of memory banks. Each memory bank segment is arranged adjacent to, and occupies less area than, one of the memory banks of the first set.

Of course, the present invention is not limited to the above features and advantages. Those skilled in the art will recognize additional features and advantages upon reading the following detailed description, and upon viewing the accompanying drawings.

DETAILED DESCRIPTION OF THE INVENTION

Figure 1:
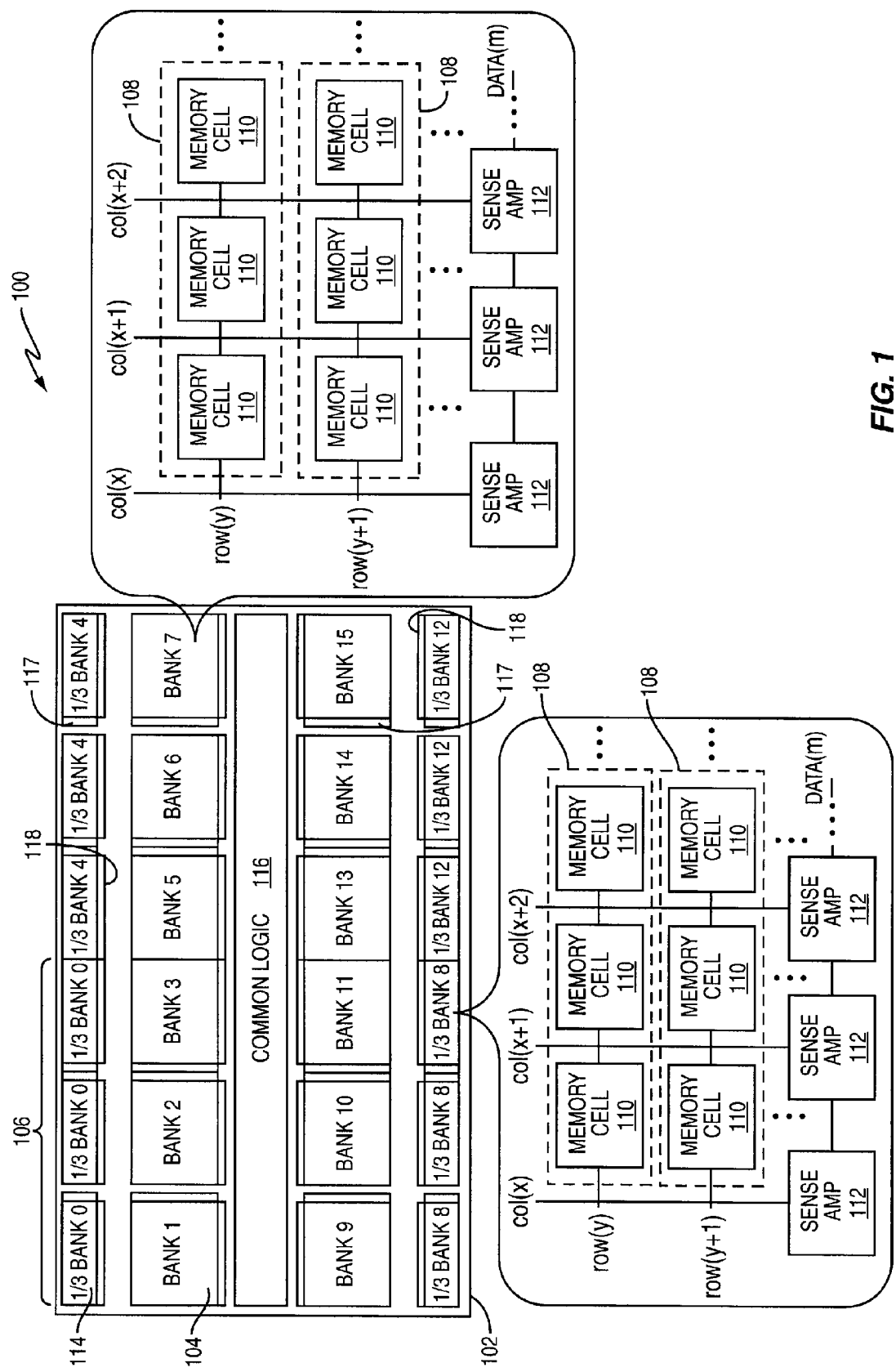
FIG. 1 is a block diagram of an embodiment of a memory device including both unified and split memory banks.

FIG. 1 illustrates an embodiment of a memory device 100. The memory device 100 is fabricated on a semiconductor substrate 102 and includes a plurality of memory banks 104, 106. Each memory bank 104, 106 has rows 108 of memory cells 110 for storing information. A particular memory cell 110 can be accessed by selecting the desired bank 104, 106 and activating the appropriate row and column within the selected bank. Local sense amplifier circuitry 112 senses data stored in the activated memory cell 110 during a read operation and stores data in the cell 110 during a write operation as is well known in the art. In one embodiment, the memory cells 110 are volatile memory cells such as DRAM, SRAM (static random access memory) or CAM (content addressable memory) cells, and are thus periodically refreshed. In another embodiment, the cells 110 are non-volatile memory cells such as flash or MRAM (magnetoresistive random access memory) cells.

In either embodiment, a first set of the memory banks 104, 106 are "unified" meaning that the memory cell rows 108 are arranged in a physically continuous manner within each individual unified bank 104. Thus, the unified memory banks 104 are not physically divided into smaller sections or segments of memory cell rows 108. A second set of the memory banks are "split" meaning that they are physically subdivided into smaller segments 114 of memory cell rows 108. The memory cell rows 108 associated with each individual split memory bank 106 are divided into at least two segments 114 physically separated from each other and from the unified memory banks 104. This way, not all of the memory cell rows 108 associated with individual ones of the split memory banks 106 are arranged in a physically continuous manner.

FIG. 1 illustrates one embodiment of the memory device 100 where the split banks 106 each have three separate segments 114 of memory cell rows 108, each segment 114 including ⅓ the total rows 108 included in the unified banks 104. For example, if the unified banks 104 each have 32 rows 108 of memory cells 110, then the memory bank segments 114 of FIG. 1 each have eleven rows of memory cells 110 (where one row is not used or serves as a redundant row). Other embodiments employ different memory bank segment sizes. In one embodiment, the split banks 106 are physically divided into two segments 114 each having ½ the total rows 108 included in the unified banks 104. In another embodiment, each memory bank segment 114 includes ¼ the total rows 108 included in the unified banks 104. Generally, the memory bank segments 114 may have any desirable number of memory cells rows 108. Moreover, the memory bank segments 114 need not be of the same size.

Figure 2:
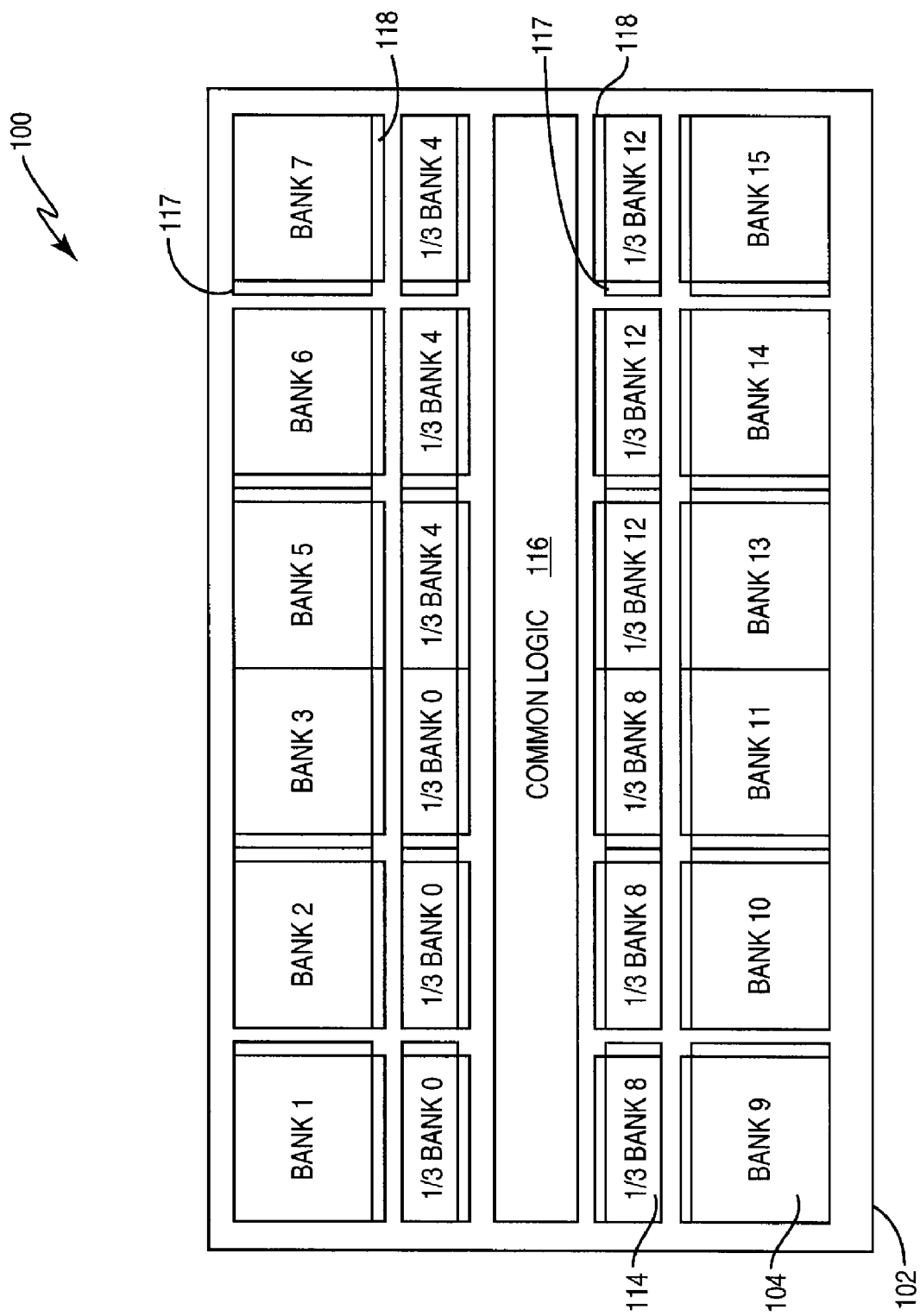
FIG. 2 is a block diagram of another embodiment of a memory device including both unified and split memory banks.

Regardless, each memory bank segment 114 is arranged adjacent one of the unified memory banks 104 on the semiconductor substrate 102. FIG. 1 illustrates one embodiment of the memory device 100 where the unified memory banks 104 are disposed between the memory bank segments 114 and logic 116 common to both the unified and split memory banks 104, 106 such as bias circuitry, input/output circuitry, power regulation and distribution circuitry, control logic, decoder logic, etc. This way, the unified memory banks 104 are located nearest the common logic 116. FIG. 2 illustrates another embodiment of the memory device 100 where the memory bank segments 114 are arranged closer to the common logic 116 than the unified memory banks 104. In either embodiment, each memory bank segment 114 has fewer memory cell rows 108 than the adjacent unified memory bank 104, occupying less area on the semiconductor substrate 102. The size and location of the memory bank segments 114 can be selected so that the unified and split memory banks 104, 106 are optimally arranged about the common logic 116, e.g., in view of a particular package configuration.

Figure 3:
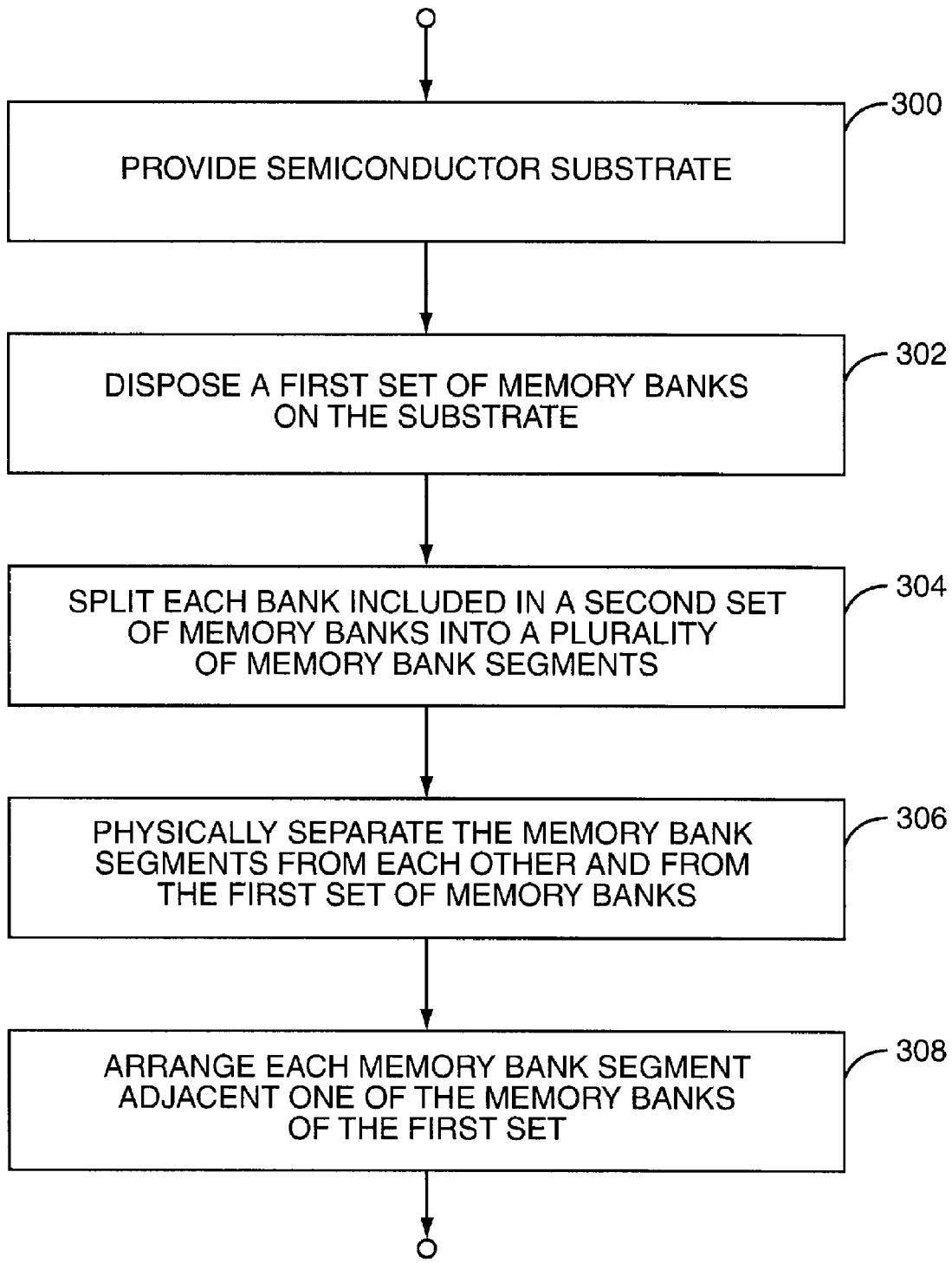
FIG. 3 is a logic flow diagram of an embodiment of program logic for manufacturing a memory device including both unified and split memory banks.

FIG. 3 illustrates an embodiment of program logic for manufacturing the memory device 100. The program logic begins with the semiconductor substrate 102 being provided (Step 300). The unified memory banks 104 are disposed on the semiconductor substrate 102 (Step 302). The split memory banks 106 are also disposed on the semiconductor substrate 102. The split memory banks 106 are disposed on the substrate 102 by splitting each of the banks 106 into a plurality of the memory bank segments 114 (Step 304). The memory bank segments 114 are physically separated from each other and from the unified memory banks 104 (Step 306). Each memory bank segment 114 is arranged adjacent one of the unified memory banks 104 (Step 308). As such, each memory bank segment 114 occupies less area than the adjacent unified memory bank 104. The memory device 100 can be optimally arranged on the substrate 102 so that the device 100 does not extend too far in either the x or y-direction because the bank segments 114 can be positioned on the substrate 102 in smaller areas than the unified banks 104.

The unified and split memory banks 104, 106 are uniquely selectable during operation of the memory device 100. A particular one of the memory banks 104, 106 is selected in response to a bank address signal(s) provided to the memory device 100. The bank address signal(s) indicates which banks 104, 106 are to be selected during memory operations such as reads and writes. The memory device 100 also includes row decoder circuitry 117 and column decoder circuitry 118, e.g., as shown in FIGS. 1 and 2 for accessing particular memory cells 110 within the selected bank. The row decoder circuitry 117 activates a particular row 108 of memory cells 110 within the selected bank in response to address signals provided to the memory device 100. The column decoder circuitry 118 similarly activates the local sense amplifier circuitry 112 indicated by the address signals. This way, data can be written to or read from the addressed memory cell locations of the memory device 100.

Figure 4:
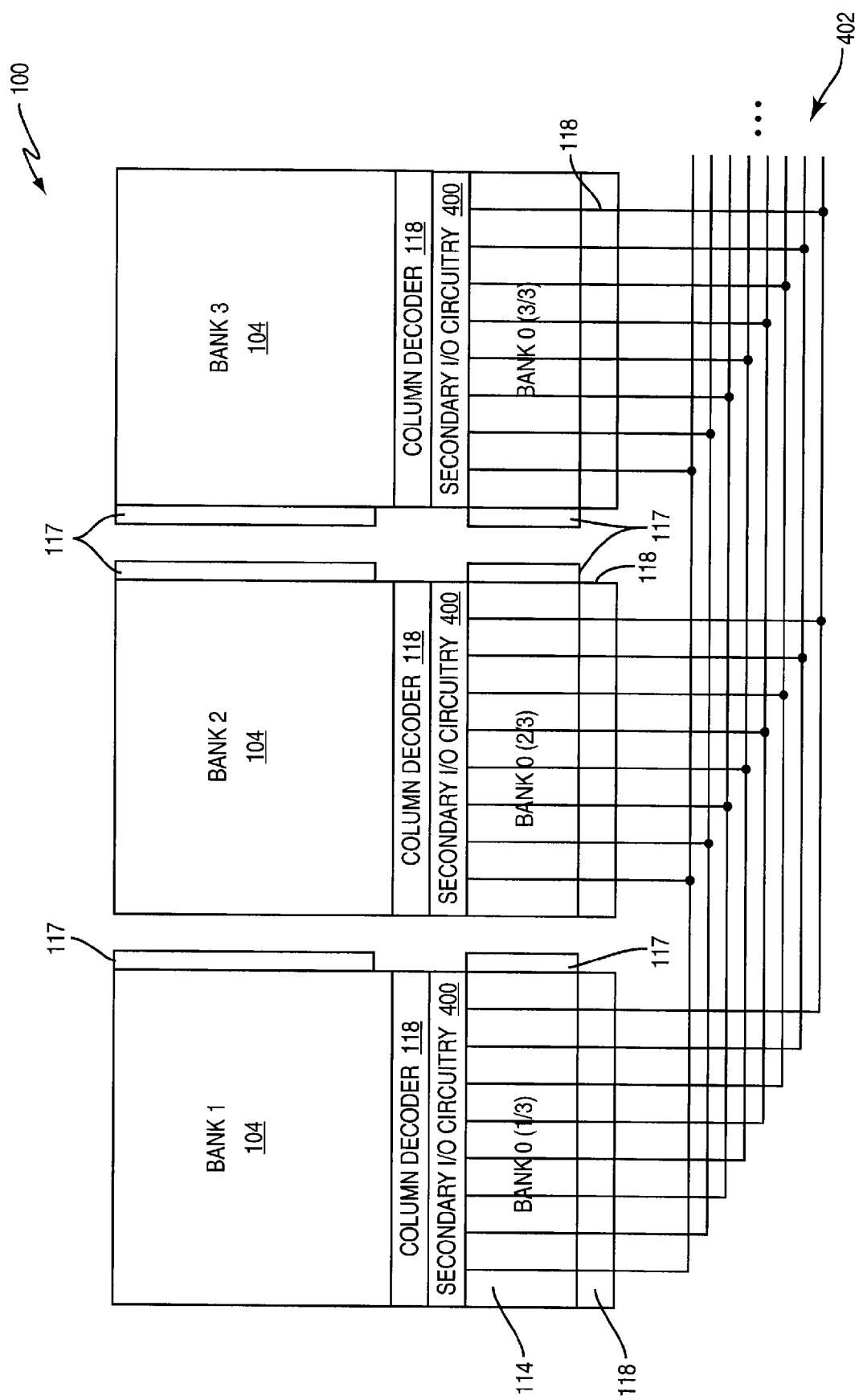
FIG. 4 is a block diagram of another embodiment of a memory device including unified and split memory banks.

FIG. 4 illustrates another embodiment of the memory device 100 where the device includes secondary input/output circuitry 400 coupled to the memory banks 104, 106. The secondary input/output circuitry 400 facilitates the movement of data between a data bus 402 and the local input/output circuitry 112 included in the memory banks 104, 106. Sense amplifier circuitry (not shown) included in the secondary input/output circuitry 400 amplifies data sensed by the local input/output circuitry 112 during read operations and drives the data bus 402 with the amplified data. Conversely, driver circuitry (not shown) included in the secondary input/output circuitry 400 writes data provided on the bus 402 to the local input/output circuitry 112.

Figure 5:
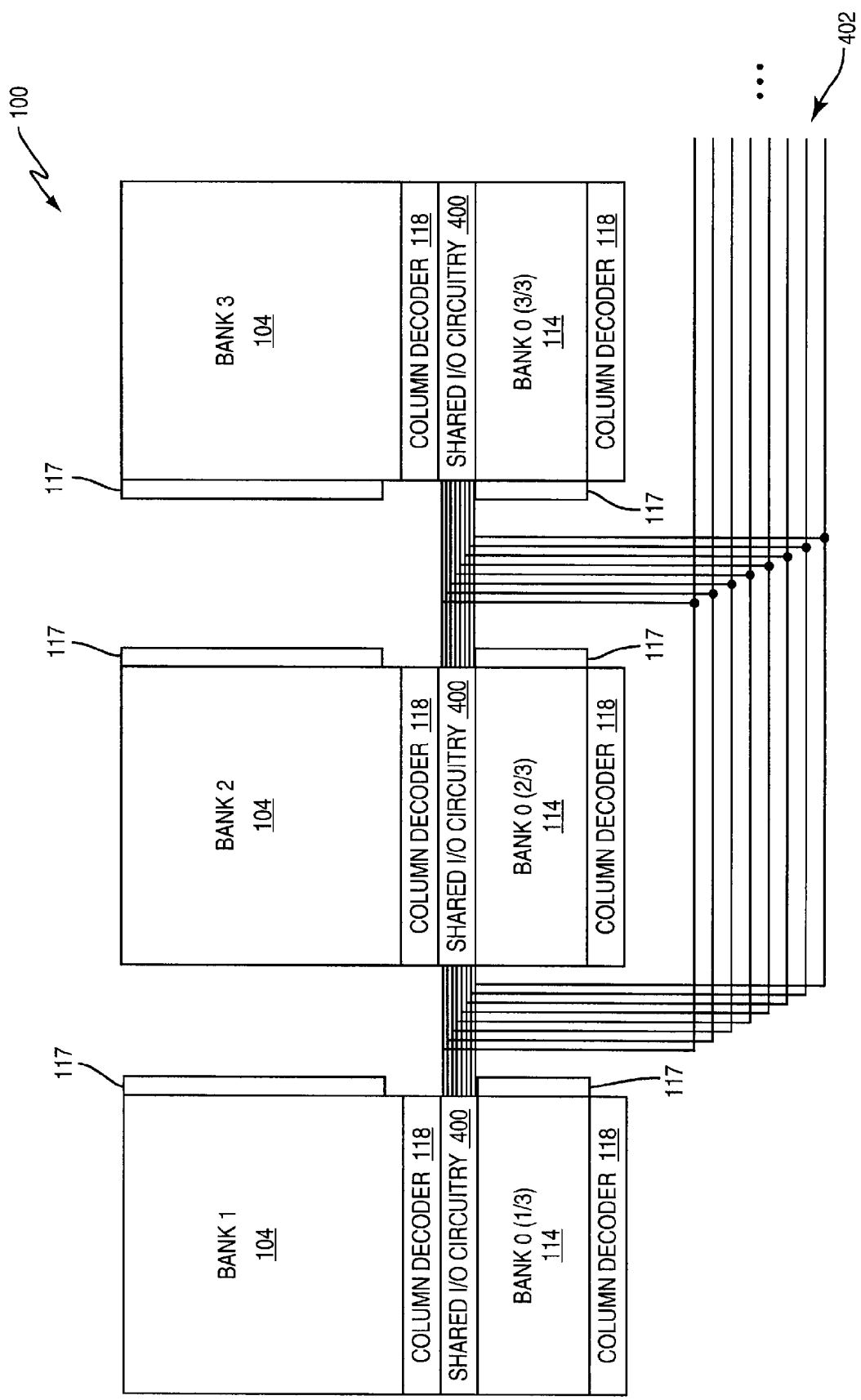
FIG. 5 is a block diagram of yet another embodiment of a memory device including both unified and split memory banks.

In one embodiment, each memory bank segment 114 shares the secondary input/output circuitry 400 and/or the column decoder circuitry 118 with the adjacent unified memory bank 104 as shown in FIG. 4. According to this embodiment, the data bus lines 402 are routed over the memory bank segments 114 to the shared secondary input/output circuitry 400. FIG. 5 illustrates another embodiment of the memory device 100 where the data bus lines 402 are routed between the memory bank segments 114 to the shared secondary input/output circuitry 400. Alternatively, the memory bank segments 114 and the unified memory banks 104 do not share the secondary input/output circuitry 400 and/or the column decoder circuitry 118 as shown in FIGS. 1 and 2. Either way, different ones of the memory cell rows 108 included in the unified and split memory banks 104, 106 are addressable via common bank and address signals provided to the memory device 100.

Figure 6:
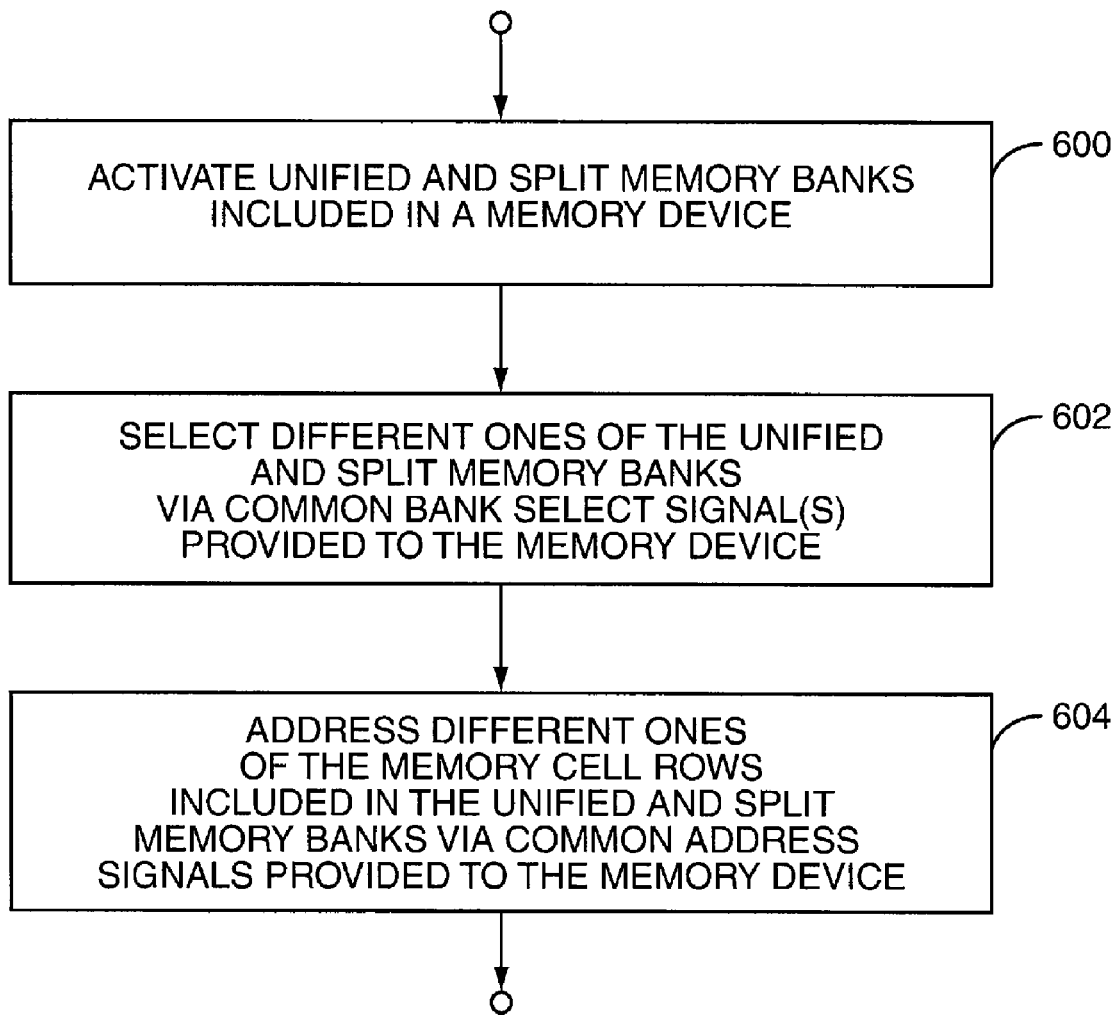
FIG. 6 is a logic flow diagram of an embodiment of program logic for using a memory device including both unified and split memory banks.

FIG. 6 illustrates an embodiment of program logic for addressing the memory cells 110 within the memory device 100. The program logic begins with the unified and split memory banks 104, 106 being activated so that the banks 104, 106 are ready for selection (Step 600). Different ones of the unified and split memory banks 104, 106 are selected via one or more common bank select signals provided to the memory device 100 (Step 602). Different ones of the memory cell rows 108 included in the unified and split memory banks 104, 106 are addressed via common address signals provided to the memory device 100 (Step 604). In one embodiment, the split memory banks 114 are row addressable in the same order as the unified memory banks 104.

Figure 7:
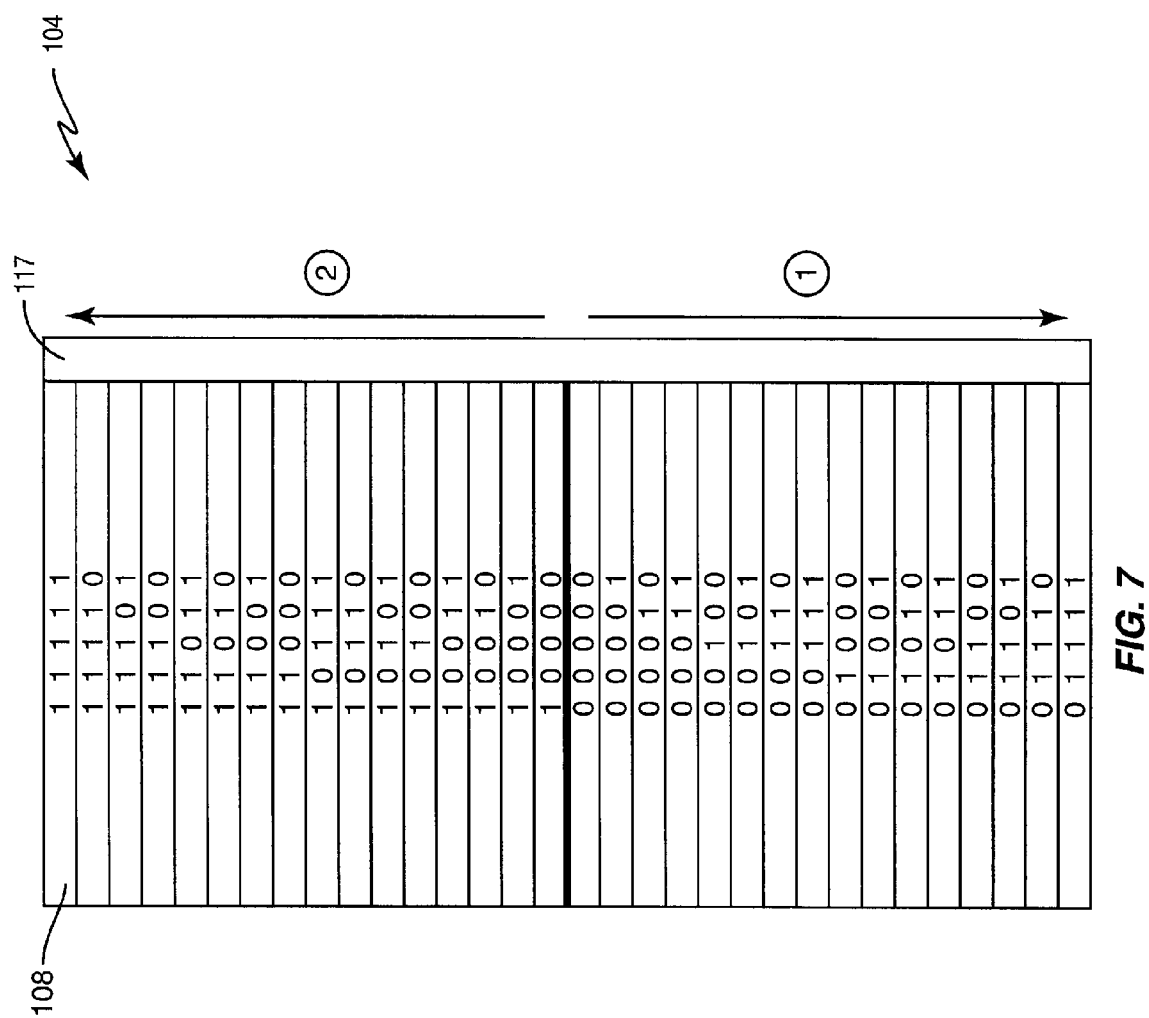
FIG. 7 is a block diagram of an embodiment of a unified memory bank included in a memory device having both unified and split memory banks.
Figure 8:
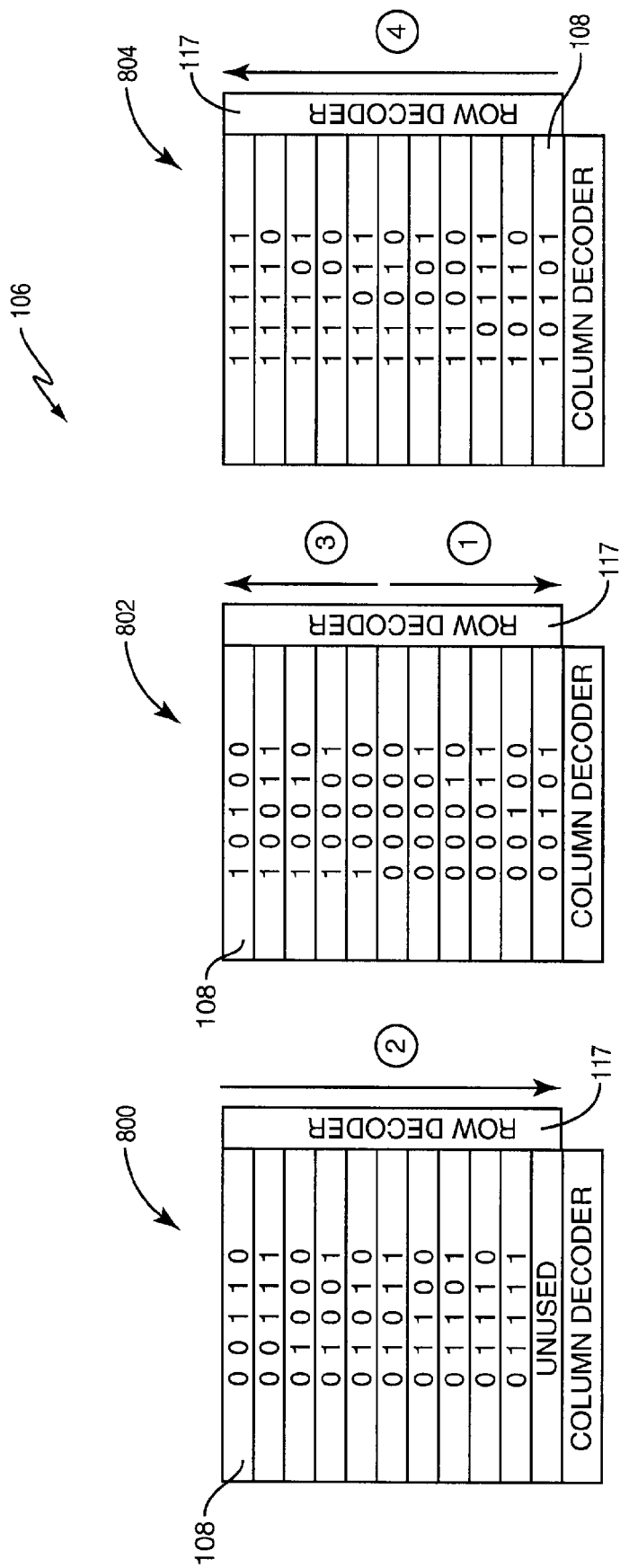
FIG. 8 is a block diagram of an embodiment of a split memory bank included in a memory device having both unified and split memory banks.

FIGS. 7 and 8 illustrate an embodiment of the unified and split memory banks, 104, 106, respectively, where the split memory bank 106 of FIG. 8 is row addressable in the same order as the unified memory bank 104 of FIG. 7. The unified and split memory banks 104, 106 may have any number of memory cell rows 108. Thirty-two rows 108 are shown in FIGS. 7 and 8 for ease of illustration only. During testing, row 0 in the unified memory bank 104 of FIG. 7 is tested first by activating row address '00000'. Row 0 is physically located in the middle of the unified bank 104. Row 1 (row address '00001') is then tested followed by row 2 (row address 00010) and so on as indicated by the line labeled '1' in FIG. 7. Testing wraps back to row 17 which is located above row 16 by activating row address '10000'. Testing of the unified memory bank 104 continues until the last row (row address '11111') has been tested as indicated by the line labeled '2' in FIG. 7. All rows 108 within the unified memory bank 104 are sequentially tested by periodically changing one or more bits of the row address according to this embodiment.

The split memory bank 106 embodiment shown in FIG. 8 has the same number of total rows 108 as the unified bank 104 embodiment of FIG. 7, but is physically divided into three smaller segments 800, 802, 804 of rows 108. As explained above, the split memory bank 106 may be physically subdivided into any desirable number of segments 114. With this understanding, the rows 108 included in the split memory bank 106 of FIG. 8 are addressed in the same order as those included in the unified memory bank 104 of FIG. 7. Particularly, the middle row of the middle bank segment 802 is tested first by activating row address '00000'. Testing continues downward until the last row 108 in the middle segment 802 is tested (row address '00101') as indicated by the line labeled '1' in FIG. 8. The leftmost memory bank segment 800 is then tested instead of the upper portion of the middle segment 802 as indicated by the line labeled '2' in FIG. 8. Next, the upper portion of the middle bank segment 802 is tested by sequentially activating row addresses '10000' to '10100' as indicated by the line labeled '3' in FIG. 8. Finally, the rightmost bank segment 804 is tested by activating row addresses '10101' to '11111' as indicated by the line labeled '4' in FIG. 8. This ensures that the split memory bank 106 of FIG. 8 is logically tested in the same order as the unified bank 104 of FIG. 7.

Figure 9:
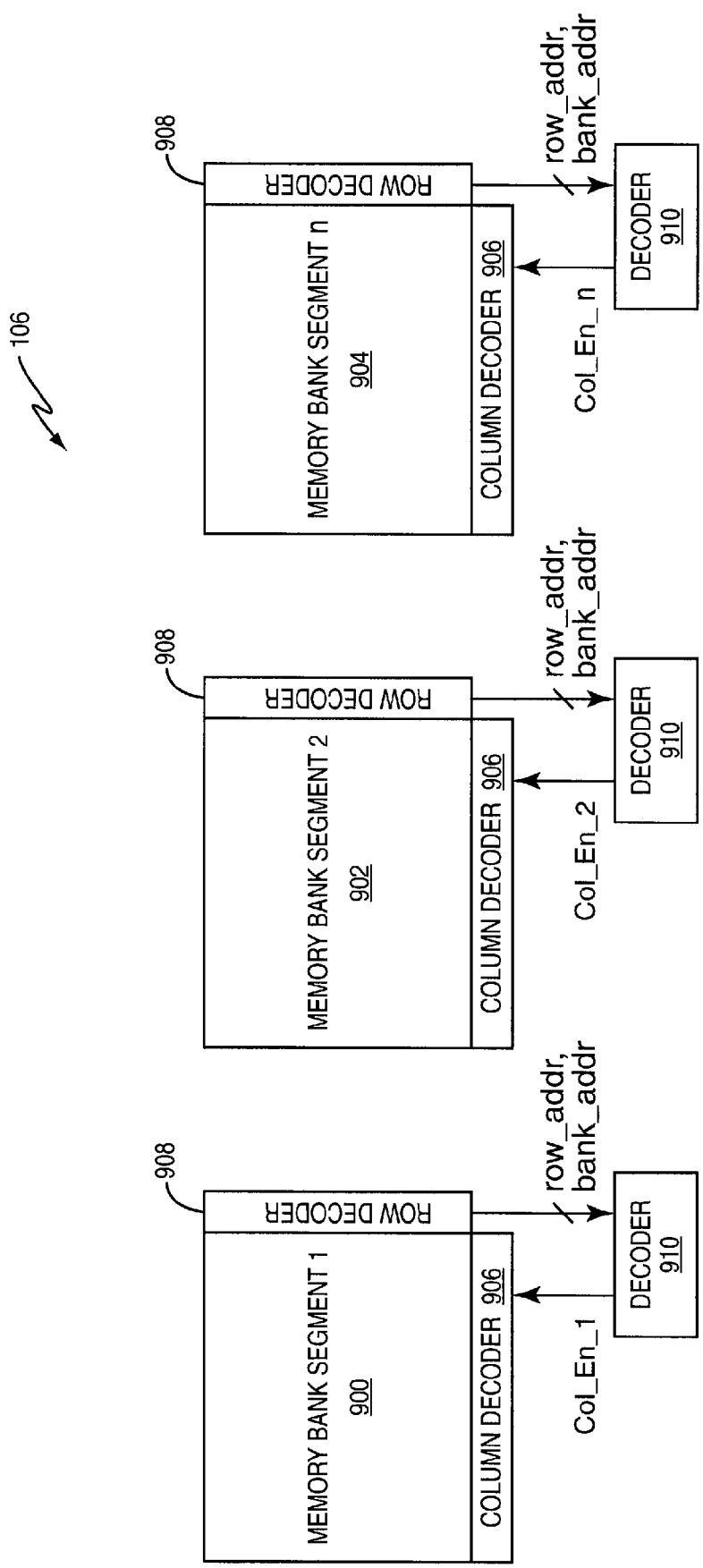
FIG. 9 is a block diagram of another embodiment of a split memory bank included in a memory device having both unified and split memory banks.

FIG. 9 illustrates another embodiment of the split memory bank 106 included in the memory device 100. According to this embodiment, the split memory bank 106 has n physically separated segments 900, 902, 904 of memory cell rows 108. Each memory bank segment 900, 902, 904 has a column decoder circuit 906 and a row decoder circuit 908 coupled thereto. In one embodiment, the column decoder circuits 906 function identically. Thus, all of the column decoder circuits 906 are activated when the split bank 106 is selected. Current draw increases and data bus contention may occur when all of the decoder circuits 906 are activated at the same time even though the desired memory cell row 108 is located within only one of the memory bank segments 900, 902, 904. Additional decoder circuitry 910 is provided for enabling only the column decoder circuit 906 coupled to the memory bank segment 900, 902, 904 containing the memory cell row 108 being accessed. The remaining column decoder circuits 906 are disabled by the decoder circuitry 910. This way, only one of the column decoder circuits 906 is active when the split bank 106 is selected.

The decoder circuitry 910 determines which column decoder circuit 906 is to be activated based on the bank (bank_addr) and row (row_addr) addresses. If the bank address indicates that the split memory bank 106 is not selected, the decoder circuitry 910 deactivates all of the column decoder circuits 906. Otherwise, the decoder circuitry 910 examines the row address to determine which decoder circuit 906 should be activated. The decoder circuitry 910 activates a column enable signal (Col_En_x) provided to the memory bank segment 900, 902, 904 containing the row 108 being addressed. The enable signal activates the corresponding column decoder circuit 906. The decoder circuitry 910 also deactivates the other column enable signals so that the remaining column decoder circuits 906 are disabled. For example, if the split memory bank 106 is selected and the row 108 being addressed is contained in the second memory bank segment 902, the decoder circuitry 910 activates the Col_En_2 enable signal and deactivates the other column enable signals. Accordingly, only the column decoder circuit 906 coupled to the second memory bank segment 902 is activated, reducing power consumption and preventing data bus contention.

With the above range of variations and applications in mind, it should be understood that the present invention is not limited by the foregoing description, nor is it limited by the accompanying drawings. Instead, the present invention is limited only by the following claims and their legal equivalents.

What is claimed is:

1. A memory device, comprising:
   a semiconductor substrate;
   a first set of memory banks disposed on the semiconductor substrate, each memory bank of the first set having a continuous physical arrangement of memory cell rows so that each memory bank of the first set is unified;
   a second set of memory banks disposed on the semiconductor substrate, each memory bank of the second set being split into a plurality of memory bank segments physically separated from each other and from the first set of memory banks so that each memory bank of the second set is split;
   wherein different ones of the unified and split memory banks are selectable via one or more common bank select signals provided to the memory device and row addressable via common address signals provided to the memory device; and
   wherein each memory bank segment is arranged adjacent to, and occupies less area than, one of the memory banks of the first set.

2. The memory device of claim 1, wherein the memory bank segments are arranged between the memory banks of the first set and logic common to both sets of memory banks.

3. The memory device of claim 1, wherein each memory bank segment shares at least one of column decoder circuitry and input/output circuitry with the adjacent memory bank.

4. The memory device of claim 3, wherein signal lines coupled to the input/output circuitry are routed over the memory bank segments.

5. The memory device of claim 1, further comprising circuitry configured to enable column decoder circuitry coupled to one of the memory bank segments and disable column decoder circuitry coupled to the other memory bank segments associated with the same memory bank when that memory bank is selected during a memory operation.

6. A method of manufacturing a memory device, comprising:
   providing a semiconductor substrate;
   disposing a first set of memory banks on the semiconductor substrate, each memory bank of the first set having a continuous physical arrangement of memory cell rows so that each memory bank of the first set is unified;
   disposing a second set of memory banks on the semiconductor substrate, comprising:
      splitting each memory bank of the second set into a plurality of memory bank segments physically separated from each other and from the first set of memory banks so that each memory bank of the second set is split, so that different ones of the unified and split memory banks are selectable via one or more common bank select signals provided to the memory device and row addressable via common address signals provided to the memory device; and
      arranging each memory bank segment adjacent one of the memory banks of the first set so that each memory bank segment occupies less area than the adjacent memory bank.

7. The method of claim 6, wherein arranging each memory bank segment adjacent one of the memory banks of the first set comprises arranging the memory bank segments between the memory banks of the first set and logic common to both sets of memory banks.

8. The method of claim 6, wherein arranging each memory bank segment adjacent one of the memory banks of the first set comprises coupling at least one of column decoder circuitry and input/output circuitry to each memory bank segment and the adjacent memory bank.

9. The method of claim 8, further comprising routing signal lines coupled to the input/output circuitry over the memory bank segments.

10. The method of claim 6, further comprising disposing circuitry on the semiconductor substrate operable to enable column decoder circuitry coupled to one of the memory bank segments and disable column decoder circuitry coupled to the other memory bank segments associated with the same memory bank when that memory bank is selected during a memory operation.

11. A memory device, comprising:
a plurality of unified memory banks each having a continuous physical arrangement of memory cell rows;
a plurality of split memory banks each having at least two segments of memory cell rows physically separated from each other and from the unified memory banks;
wherein different ones of the unified and split memory banks are selectable via one or more common bank select signals provided to the memory device and row addressable via common address signals provided to the memory device; and
wherein each memory bank segment is arranged adjacent to, and occupies less area than, one of the unified memory banks.

12. The memory device of claim 11, wherein the split memory banks are row addressable in the same order as the unified memory banks.

13. The memory device of claim 11, wherein the memory bank segments comprise the same number of memory cell rows.

14. The memory device of claim 13, wherein the memory bank segments comprise one third of the memory cell rows included in the unified memory banks.

15. A method of manufacturing a memory device, comprising:
providing a plurality of unified memory banks each having a continuous physical arrangement of memory cell rows;
providing a plurality of split memory banks each having at least two segments of memory cell rows physically separated from each other and from the unified memory banks;
arranging each memory bank segment adjacent one of the unified memory banks so that each memory bank segment occupies less area than the adjacent unified memory bank;
providing one or more common bank select signals operable to select different ones of the unified and split memory banks; and
providing common address signals operable to address different ones of the memory cell rows included in the unified and split memory banks.

16. The method of claim 15, wherein arranging each memory bank segment adjacent one of the unified memory banks comprises arranging the memory bank segments between the unified memory banks and logic common to the unified and split memory banks.

17. The method of claim 15, wherein the split memory banks are row addressable in the same order as the unified memory banks.

18. The method of claim 15, wherein the memory bank segments comprise the same number of memory cell rows.

19. The method of claim 18, wherein the memory bank segments comprise one third of the memory cell rows included in the unified memory banks.

20. A method of using a memory device, comprising:
activating different ones of unified memory banks each having a continuous physical arrangement of memory cell rows;
activating different ones of split memory banks each having at least two segments of memory cell rows physically separated from each other and from the unified memory banks, wherein each memory bank segment is arranged adjacent to, and occupies less area than, one of the unified memory banks;
selecting different ones of the unified and split memory banks via one or more common bank select signals provided to the memory device; and
addressing different ones of the memory cell rows included in the unified and split memory banks via common address signals provided to the memory device.

21. The method of claim 20, wherein addressing different ones of the memory cell rows included in the unified and split memory banks comprises selectively enabling at least one of column decoder circuitry and input/output circuitry shared between each memory bank segment and the adjacent unified memory bank.

22. The method of claim 20, further comprising enabling column decoder circuitry coupled to one of the memory bank segments and disabling column decoder circuitry coupled to the other memory bank segments associated with the same split memory bank when that split memory bank is selected during a memory operation.

23. The method of claim 20, wherein the split memory banks are row addressable in the same order as the unified memory banks.

24. The method of claim 20, wherein the memory bank segments comprise the same number of memory cell rows.

25. The method of claim 24, wherein the memory bank segments comprise one third of the memory cell rows included in the unified memory banks.

* * * * *